(12) United States Patent
Kajimoto et al.

(10) Patent No.: US 12,471,442 B2
(45) Date of Patent: Nov. 11, 2025

(54) LIGHT-EMITTING APPARATUS, DISPLAY APPARATUS, IMAGING APPARATUS, AND ELECTRONIC EQUIPMENT

(71) Applicant: CANON KABUSHIKI KAISHA, Tokyo (JP)

(72) Inventors: Norifumi Kajimoto, Kanagawa (JP); Koji Ishizuya, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 738 days.

(21) Appl. No.: 17/703,854

(22) Filed: Mar. 24, 2022

(65) Prior Publication Data

US 2022/0320452 A1   Oct. 6, 2022

(30) Foreign Application Priority Data

Mar. 31, 2021 (JP) .................. 2021-059049

(51) Int. Cl.
*H10K 59/00* (2023.01)
*H10K 50/11* (2023.01)
*H10K 59/121* (2023.01)
*H10K 59/38* (2023.01)
*H10K 59/80* (2023.01)
*H10K 102/00* (2023.01)

(52) U.S. Cl.
CPC ........... *H10K 59/121* (2023.02); *H10K 50/11* (2023.02); *H10K 59/38* (2023.02); *H10K 59/80515* (2023.02); *H10K 59/876* (2023.02); *H10K 59/8792* (2023.02); *H10K 59/878* (2023.02); *H10K 59/879* (2023.02); *H10K 2102/351* (2023.02)

(58) Field of Classification Search
CPC ....... H10K 59/80515; H10K 59/80521; H10K 59/121; H10K 59/876

See application file for complete search history.

(56) References Cited

U.S. PATENT DOCUMENTS

| | | |
|---|---|---|
| 2014/0197385 A1 | 7/2014 | Madigan |
| 2015/0060815 A1 | 3/2015 | Sato |
| 2015/0060832 A1 | 3/2015 | Ito |

(Continued)

FOREIGN PATENT DOCUMENTS

| | | |
|---|---|---|
| EP | 3664147 A1 | 6/2020 |
| JP | 2004039500 A | 2/2004 |

(Continued)

*Primary Examiner* — Reema Patel
(74) *Attorney, Agent, or Firm* — Canon U.S.A., Inc. IP Division

(57) ABSTRACT

A light-emitting apparatus including: a first lower electrode; a second lower electrode; a functional layer covering the first lower electrode and the second lower electrode; and an upper electrode on the functional layer, the light-emitting apparatus further including a third lower electrode between the first lower electrode and the second lower electrode, wherein the third lower electrode has an inclined portion inclined with respect to an upper surface of the first lower electrode, and the third lower electrode, an insulating layer, the functional layer, and the upper electrode are arranged in this order in a direction perpendicular to the inclined portion.

17 Claims, 11 Drawing Sheets

(56) References Cited

U.S. PATENT DOCUMENTS

| | | | |
|---|---|---|---|
| 2015/0379924 A1* | 12/2015 | Matsueda | H10K 59/352 |
| | | | 345/77 |
| 2017/0117499 A1 | 4/2017 | Zhang | |
| 2017/0213880 A1 | 7/2017 | Nendai | |
| 2019/0074466 A1 | 3/2019 | Choi | |
| 2019/0181188 A1 | 6/2019 | Youn | |
| 2019/0305051 A1* | 10/2019 | Takahashi | H10K 59/12 |
| 2020/0044001 A1* | 2/2020 | Lim | H10K 59/131 |
| 2020/0357854 A1* | 11/2020 | Koshihara | H10K 59/38 |

FOREIGN PATENT DOCUMENTS

| | | |
|---|---|---|
| JP | 2012155953 A | 8/2012 |
| JP | 2020184479 A | 11/2020 |
| JP | 2020194673 A | 12/2020 |
| WO | 2020/021399 A1 | 1/2020 |
| WO | 2020/102984 A1 | 5/2020 |
| WO | 2020/105544 A1 | 5/2020 |

* cited by examiner

LIGHT-EMITTING APPARATUS, DISPLAY APPARATUS, IMAGING APPARATUS, AND ELECTRONIC EQUIPMENT

BACKGROUND OF THE INVENTION

Field of the Invention

The present disclosure relates to a light-emitting apparatus, a display apparatus, an imaging apparatus, and electronic equipment.

Description of the Related Art

In recent years, display apparatuses and electronic equipment with the display apparatuses have been widely used. Among them, light-emitting apparatuses with organic EL elements have been widely used because of their high contrast, light weight, and high degree of flexibility in shape due to the adoption of flexible substrates.

An organic light-emitting element has a first electrode, a second electrode, and an organic compound layer between the first electrode and the second electrode, and emits light when electric charges are supplied from the first electrode and the second electrode. The organic light-emitting elements are arranged in a matrix and control light emission in a display apparatus. The first electrode is a lower electrode, and the second electrode is provided as one electrode for a plurality of organic light-emitting elements. In other words, the second electrode is known to be a common electrode.

The organic compound layer of the organic light-emitting element may be configured to be shared by a plurality of organic light-emitting elements. In such a case, electric charges supplied from the first electrode may be supplied to an adjacent organic light-emitting element through the organic compound layer. Various studies have been actively made to reduce leakage current between such organic light-emitting elements.

Japanese Patent Laid-Open No. 2020-194673 (PTL 1) describes a display apparatus that includes a pixel electrode of each organic light-emitting element and an upper electrode, and the upper electrode is shared by a plurality of organic light-emitting elements. The display apparatus has an inter-pixel electrode between the pixel electrodes and applies a voltage between the inter-pixel electrode and the upper electrode to reduce electrical interference with an adjacent pixel.

Although PTL 1 discloses that voltage application to the inter-pixel electrode reduces electrical interference with an adjacent organic light-emitting element, an organic compound layer to which voltage is applied has almost the same thickness as an organic compound layer on the pixel electrode, which leaves room for improvement in voltage application to reduce the electrical interference.

SUMMARY OF THE INVENTION

The present disclosure provides a light-emitting apparatus that has a portion in which an inter-pixel electrode to which a voltage is applied is inclined with respect to a pixel electrode and thereby has the significant effects of voltage application and reduces leakage current between organic light-emitting elements.

A light-emitting apparatus includes a first lower electrode, a second lower electrode, a functional layer covering the first lower electrode and the second lower electrode, an upper electrode on the functional layer, and a third lower electrode between the first lower electrode and the second lower electrode.

The third lower electrode has an inclined portion inclined with respect to an upper surface of the first lower electrode.

The third lower electrode, an insulating layer, the functional layer, and the upper electrode are arranged in this order in a direction perpendicular to the inclined portion.

Further features of the present disclosure will become apparent from the following description of exemplary embodiments with reference to the attached drawings.

DESCRIPTION OF THE EMBODIMENTS

A light-emitting apparatus according to an embodiment of the present disclosure is a light-emitting apparatus including: a first lower electrode; a second lower electrode; a functional layer covering the first lower electrode and the second lower electrode; and an upper electrode on the functional layer, the light-emitting apparatus further including a third lower electrode between the first lower electrode and the second lower electrode, wherein the third lower electrode has an inclined portion inclined with respect to an upper surface of the first lower electrode, and the third lower electrode, an insulating layer, the functional layer, and the upper electrode are arranged in this order in a direction perpendicular to the inclined portion.

The third lower electrode of the light-emitting apparatus has the inclined portion and can apply a voltage to the functional layer in the inclined portion. A decreased thickness of the functional layer in the inclined portion can result in an increased effect of voltage application. This can reduce the leakage current.

A portion of the functional layer overlapping the inclined portion has a smaller thickness than a portion of the functional layer in contact with the first lower electrode in a plan view. This can reduce the leakage current.

First Embodiment

Figure 1A:
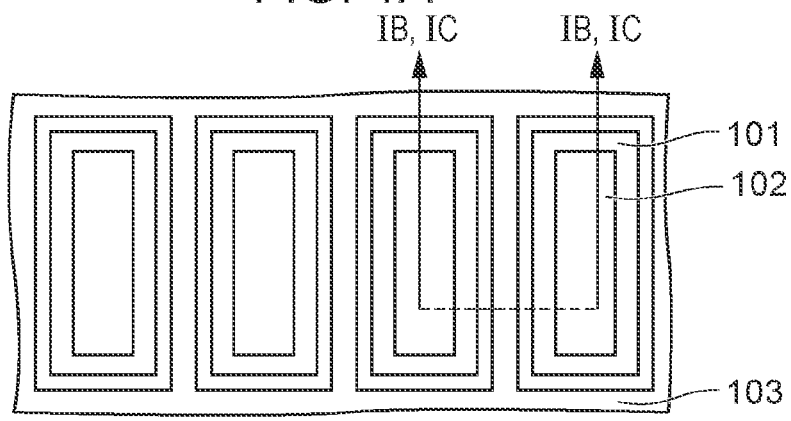
FIG. 1A is a plan view of a light-emitting apparatus according to an embodiment of the present disclosure.

FIG. 1A is a plan view of a light-emitting apparatus according to an embodiment of the present disclosure. FIG. 1A illustrates an example of a light-emitting apparatus including a matrix of organic EL elements. Pixels are quadrangular in the present embodiment but may be hexagonal, pentagonal, or circular. Although the present embodiment is illustrated in a stripe arrangement, a delta arrangement, a PenTile arrangement, or another arrangement may be used. The light-emitting apparatus has a first lower electrode 101, an end portion of which is covered with a pixel separation layer. The lower electrode 101 is in contact with a functional layer, that is, an organic compound layer, in an opening 102 of the pixel separation layer. The organic compound layer emits light in the opening 102. A third lower electrode 103 is located between the first lower electrode 101 and a second lower electrode, which is a lower electrode of an adjacent organic EL element. The third lower electrode 103, which is located around the first lower electrode 101 in FIG. 1, may take another form between the first lower electrode and the second lower electrode adjacent to the first lower electrode.

Figure 1B:
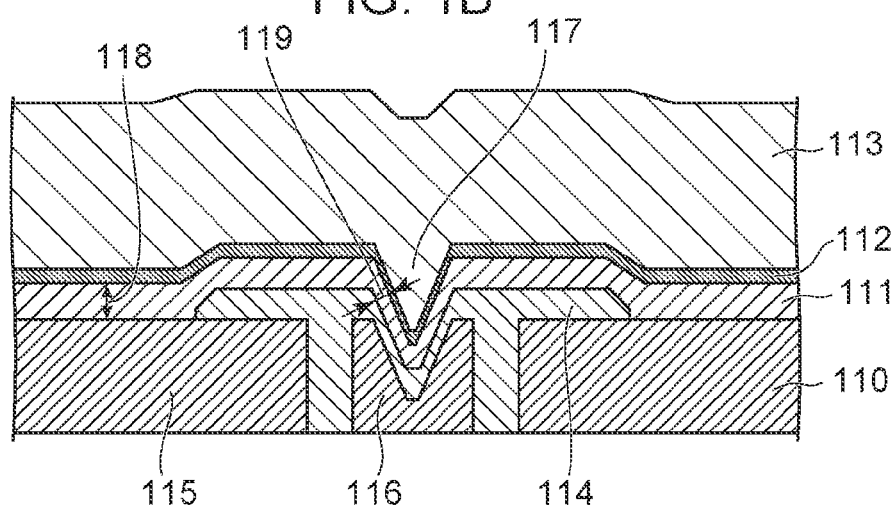
FIG. 1B is a schematic cross-sectional view of the light-emitting apparatus taken along the line IB-IB of FIG. 1A.

FIG. 1B is a schematic cross-sectional view of the light-emitting apparatus taken along the line IB-IB of FIG. 1A. FIG. 1B illustrates a first lower electrode 110, an organic compound layer 111 including a light-emitting layer, an upper electrode 112, a protective layer 113, a pixel separation layer 114, a second lower electrode 115, and a third lower electrode 116. The upper electrode 112 overlaps both the first lower electrode 110 and the second lower electrode 115 in a plan view. End portions of the first lower electrode 110 and the second lower electrode 115 are covered with the pixel separation layer 114. The pixel separation layer 114, the organic compound layer 111, and the upper electrode are arranged in this order on the third lower electrode. The third lower electrode has an inclined portion inclined with respect to the upper surface of the first lower electrode. The pixel separation layer 114, the organic compound layer 111, and the upper electrode 112 are arranged in this order in a direction perpendicular to the inclined portion. The third lower electrode 116 has a first inclined portion and a second inclined portion that is closer to the second electrode than the first inclined portion. The first inclined portion and the second inclined portion form a recess portion 117.

The recess portion can be a protrusion protruding in a first direction perpendicular to the upper surface of the first lower electrode. The first direction is downward in FIG. 1B. The "downward" in the figure refers to the direction from the upper electrode to the first lower electrode.

The organic compound layer 111 in the inclined portion of the third lower electrode has a smaller thickness than a portion of the organic compound layer in contact with the first lower electrode. More specifically, the thickness 119 of the organic compound layer in the inclined portion of the third lower electrode is smaller than the thickness 118 of the portion of the organic compound layer in contact with the first lower electrode.

A voltage is applied between the third lower electrode 116 and the upper electrode 112 in the inclined portion with a smaller thickness of the organic compound layer. Thus, the inclined portion more effectively reduces the leakage current than portions where the thickness of the organic compound layer is not decreased.

In FIG. 1B, the pixel separation layer extends from the portion covering the end portion of the first lower electrode to the portion covering the end portions of the third lower electrode 116 and the second lower electrode 115. However, the pixel separation layer may not be continuous, provided that the pixel separation layer has a portion covering the end portion of the first lower electrode, a portion covering the third lower electrode, and a portion covering the end portion of the second lower electrode.

The lower electrode may be referred to as a pixel electrode. The upper electrode 112, which is shared by a plurality of pixels, can also be referred to as a shared electrode. The organic compound layer 111 in the present embodiment is a functional layer. The organic compound layer may be composed of a plurality of layers. Although the organic compound layer 111 is illustrated as being shared by a plurality of pixels, the organic compound layer 111 may be provided for each pixel. The pixel separation layer, which is formed of an insulator, may also be referred to as an insulating layer.

Second Embodiment

Figure 1C:
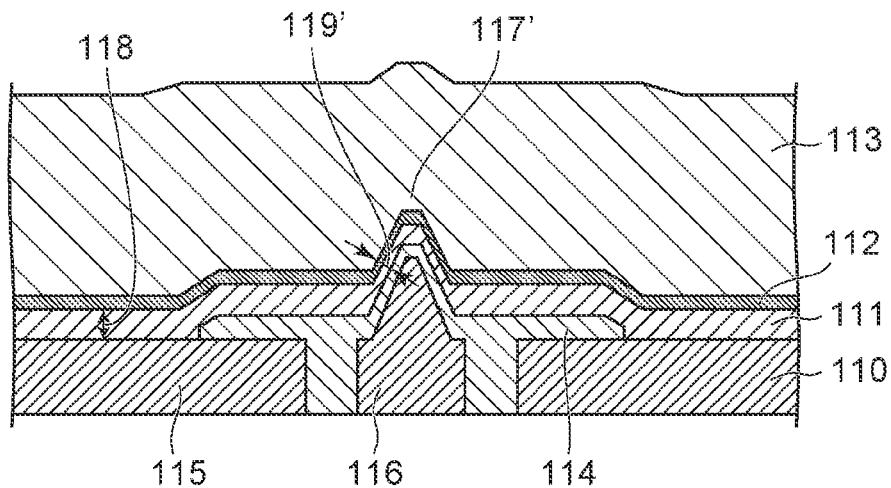
FIG. 1C is a schematic cross-sectional view of the light-emitting apparatus taken along the line IC-IC of FIG. 1A.

FIG. 1C is a schematic cross-sectional view of the light-emitting apparatus taken along the line IC-IC of FIG. 1A. Like reference numerals denote like parts throughout FIGS. 1C and 1B. In FIG. 1C, the inclined portion of the third lower electrode protrudes in the direction opposite to that of the first embodiment. More specifically, the first direction in the figure, which is downward in the first embodiment, is upward in the present embodiment. As in the recess portion 117 of the first embodiment, an inclined portion of a protrusion 117' in the present embodiment decreases the thickness of the organic compound layer 111. Like the thickness 119 of the organic compound layer in the first embodiment, the thickness 119' of the organic compound layer in the inclined portion of the protrusion is smaller than the thickness 118 of the portion of the organic compound layer in contact with the first lower electrode. A voltage applied to the organic compound layer with a smaller thickness is more effective than a voltage applied to the organic compound layer with a thickness not decreased by the inclined portion, thus resulting in more effectively reduced leakage current.

Figure 2:
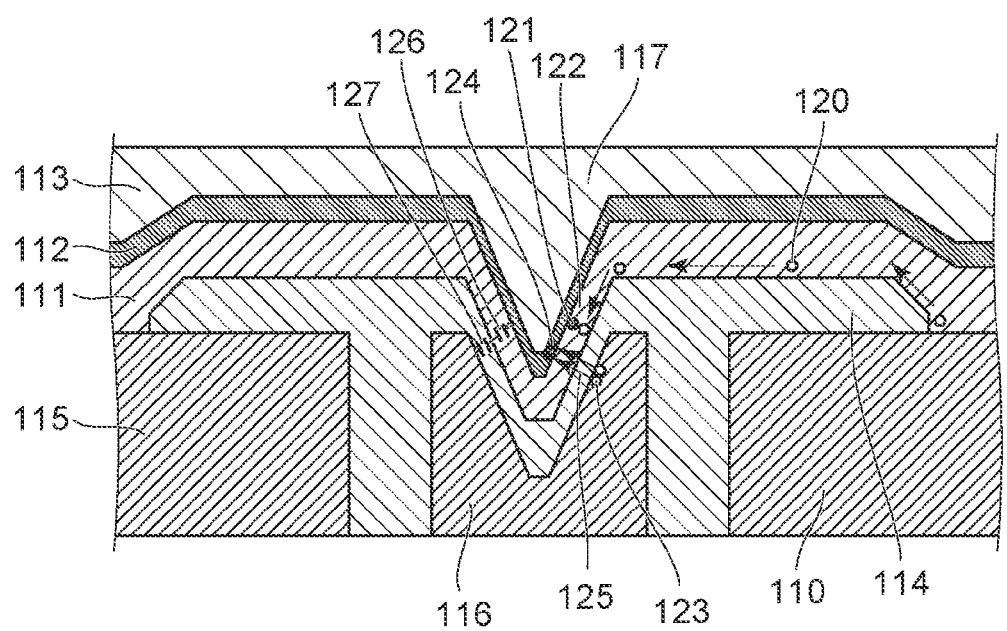
FIG. 2 is a schematic cross-sectional view for explaining the principle of reducing the leakage current of a light-emitting apparatus according to an embodiment of the present disclosure.

FIG. 2 is a schematic cross-sectional view for explaining the principle of reducing the leakage current according to the present disclosure. In the light-emitting apparatus illustrated in FIG. 2, as in the first embodiment, the inclined portion of the third lower electrode protrudes downward in the figure. Part of holes 120 injected from the first lower electrode 110 move to the inclined portion of the third lower electrode through the organic compound layer 111. In this inclined portion, part of electrons 121 injected from the upper electrode come into contact with the holes 120, cause recombination 122, and decrease the number of holes 120 reaching the second lower electrode 115. To this end, a voltage can be applied between the third lower electrode 116 and the upper electrode 112 to induce recombination between the holes 120 and the electrons 121. In FIG. 2, an electric field 125 between induced charges 123 generated on the surface of the third lower electrode and induced charges 124 generated on the surface of the upper electrode facilitates the recombination between the holes 120 and the electrons 121.

Because the thickness of the organic compound layer 111 in the inclined portion of the third lower electrode is smaller than the thickness 118 of the portion of the organic compound layer in contact with the first lower electrode, the capacitance component 126 of the organic compound layer and the capacitance component of the pixel separation layer are large. Thus, the electric field 125 is stronger than the electric field in the case where the third lower electrode does not have the inclined portion, and this promotes the recombination between the holes 120 and the electrons 121.

Although the inclined portion of the third lower electrode protrudes downward in FIG. 2, the leakage current can also be effectively reduced by the principle in the case where the inclined portion protrudes upward in the figure, that is, in the second embodiment.

Third Embodiment

Figure 3A:
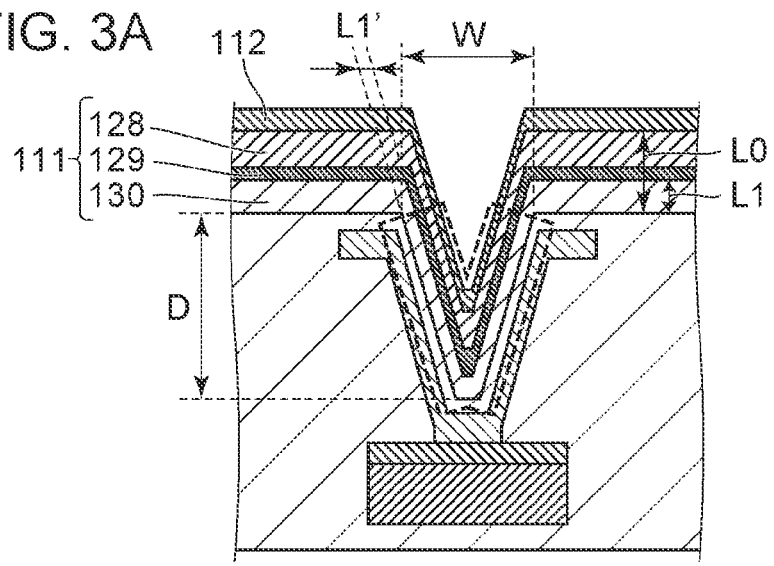
FIG. 3A is a schematic cross-sectional view of the shape of an inclined portion of a light-emitting apparatus according to an embodiment of the present disclosure.

FIG. 3A is a schematic cross-sectional view of a preferred shape of an inclined portion of a light-emitting apparatus according to an embodiment of the present disclosure. In the present embodiment, the organic compound layer 111 between the lower electrode and the upper electrode has a first organic compound layer 128, a charge generation layer 129, and a second organic compound layer 130 in this order from the lower electrode.

The charge generation layer generates holes and electrons when a voltage is applied between the lower electrode and the upper electrode. The charge generation layer contains a compound that can easily accept electrons from another organic compound. More specifically, the charge generation layer contains an organic compound with a lowest unoccupied molecular orbital (LUMO) of $-5.0$ eV or less. Specific examples of the organic compound with a LUMO of $-5.0$ eV or less include hexaazatriphenylene compounds and radialene compounds. These compounds may have a cyano group or a fluorine atom as a substituent.

In the figure, the organic compound layer has a thickness $L0$, and the first organic compound layer has a thickness $L1$. The first organic compound layer in the inclined portion of the third lower electrode has a thickness $L1'$ smaller than $L1$. A recess portion formed by the inclined portion of the third lower electrode has a width $W$ and a depth $D$. To reduce the leakage current from the first lower electrode to the second lower electrode, the recess portion can satisfy the following conditions.

$$W \geq 2L1' \qquad (1)$$

$$D \geq L1 \qquad (2)$$

The following (3) can also be satisfied.

$$D \geq L0 \qquad (3)$$

These formulae show that the length of the protrusion is greater than the length from the upper surface of the first lower electrode to the lower surface of the charge generation layer in the direction perpendicular to the upper surface of the first lower electrode.

These formulae also show that the length of the protrusion in the direction parallel to the upper surface of the first lower electrode is at least twice the length from the upper surface of the first lower electrode to the lower surface of the charge generation layer in the direction perpendicular to the upper surface of the first lower electrode.

Satisfying these conditions decreases the thickness of the organic compound layer 111, particularly in the inclined portion of the first organic compound layer 128, enables the electric field between the third lower electrode and the upper electrode to be more effectively applied, and effectively reduces the leakage current.

Figure 3B:
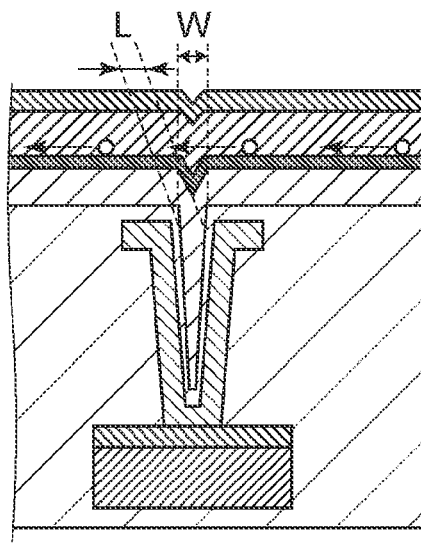
FIG. 3B is a schematic cross-sectional view of another embodiment.

FIG. 3B is a schematic cross-sectional view of a light-emitting apparatus according to another embodiment. The width W of the recess portion is smaller than that in FIG. 3A. The formula (1) is not satisfied as much as in FIG. 3A. In the present embodiment, the thickness of the organic compound layer 111 in the inclined portion is not sufficiently decreased, and the electric field applied to the organic compound layer 111 is smaller than that in FIG. 3A, so that the leakage current is not reduced as much as in FIG. 3A. Thus, as illustrated in FIG. 3A, the light-emitting apparatus can satisfy the formula (1).

Figure 3C:
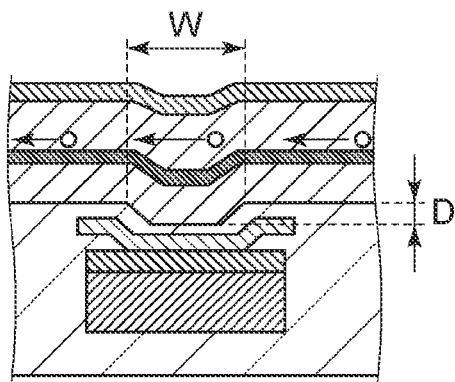
FIG. 3C is a schematic cross-sectional view of another embodiment.

FIG. 3C is a schematic cross-sectional view of a light-emitting apparatus according to another embodiment. The depth of the recess portion is smaller than that in FIG. 3A. The formula (2) is not satisfied as much as in FIG. 3A. In the present embodiment, the thickness of the organic compound layer 111 in the inclined portion is not sufficiently decreased, and the electric field applied to the organic compound layer 111 is smaller than that in FIG. 3A, so that the leakage current is not reduced as much as in FIG. 3A. Thus, as illustrated in FIG. 3A, the light-emitting apparatus can satisfy the formula (2).

Fourth Embodiment

Figure 4A:
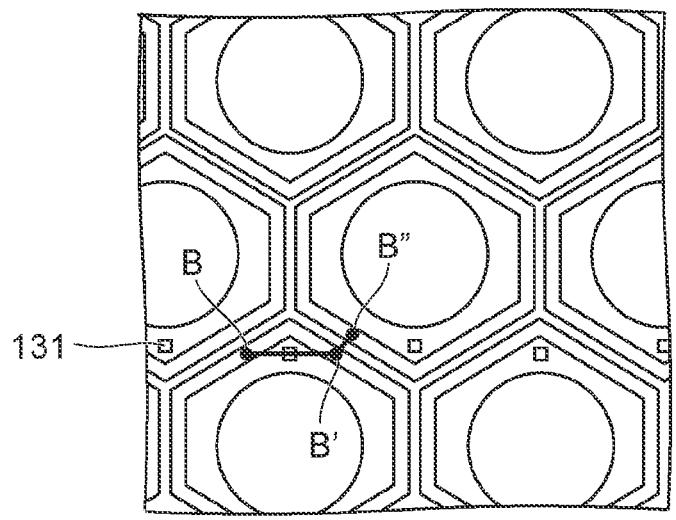
FIG. 4A is a plan view of a light-emitting apparatus according to an embodiment of the present disclosure.

FIG. 4A is a plan view of a light-emitting apparatus according to an embodiment of the present disclosure. Unlike FIG. 1A, pixels are not quadrangular. Each pixel is provided with a supply unit for supplying an electric current to the lower electrode. A contact 131 may be a connecting portion between the lower electrode and the power supply. When an additional electrode is provided below the lower electrode, the contact 131 may be a connecting portion with the additional electrode. The contact 131 may be in contact with the lower electrode in a portion that does not overlap the opening of the pixel separation layer in the lower electrode.

Figure 4B:
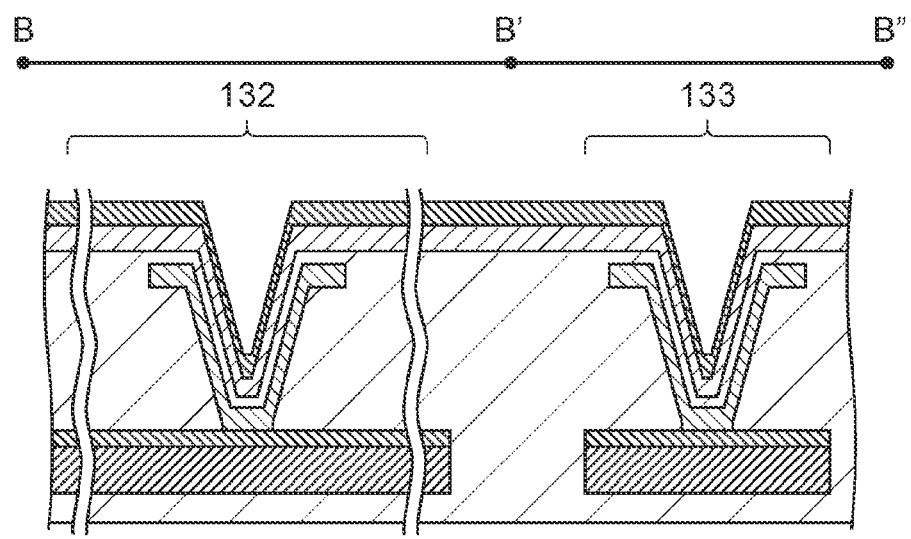
FIG. 4B is a schematic cross-sectional view of the light-emitting apparatus taken along the line B-B'-B" of FIG. 4A.

FIG. 4B is a schematic cross-sectional view taken along the line B-B'-B" of FIG. 4A. The B-B' cross section is a schematic cross-sectional view 132 of the contact 131. B'-B" is a schematic cross-sectional view 133 of the third lower electrode. The two cross-sectional views may be the same. Thus, the third lower electrode can be produced to form a contact. The same layer of the same shape may be produced by the same process. Although the cross-sectional view 132 of the contact 131 and the cross-sectional view 133 of the third lower electrode are compared in the present embodiment, the cross-sectional view to be compared may be a cross-sectional view in which the width of the contact 131 is minimum or a cross-sectional view in which the width of the third lower electrode is minimum.

Fifth Embodiment

Figure 5:
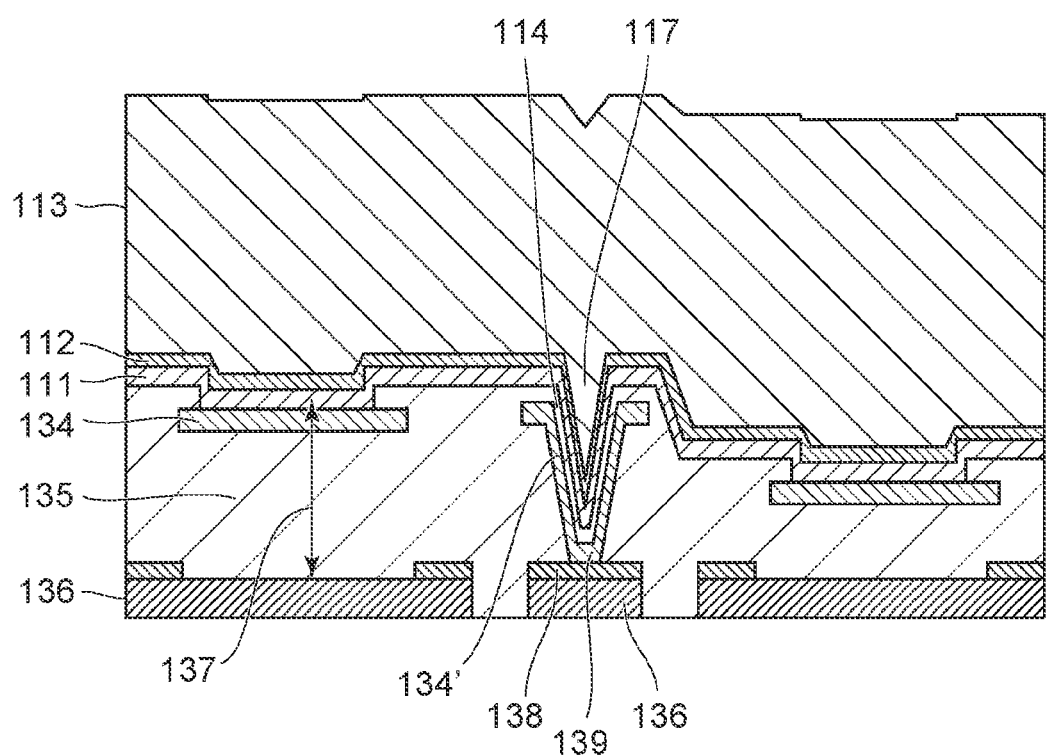
FIG. 5 is a schematic view of a light-emitting apparatus according to an embodiment of the present disclosure with an optical interference structure under a lower electrode.

FIG. 5 is a schematic cross-sectional view of an example of a light-emitting apparatus according to an embodiment of the present disclosure. The light-emitting apparatus according to the present embodiment has an electrode under the lower electrode. The lower electrode 110 is a transparent electrode 134, and an optical adjustment layer 135 and a reflective layer 136 are located under the transparent electrode. The "downward" in the figure refers to the direction from the upper electrode to the transparent electrode. The optical adjustment layer 135 may be formed integrally with or separately from the pixel separation layer 114. The reflective layer 136 is formed of a material with a high reflectance. When electric charges passing through a reflecting surface are supplied to the organic compound layer, the reflective layer may also be referred to as a reflective electrode. The optical adjustment layer may have a first optical adjustment layer overlapping the first lower electrode in a plan view and a second optical adjustment layer overlapping the second lower electrode in a plan view. The first optical adjustment layer may be formed integrally with or separately from the second optical adjustment layer. When the first optical adjustment layer is formed integrally with the second optical adjustment layer, the first optical adjustment layer may be defined as a portion overlapping the first lower electrode in a plan view, and the second optical adjustment layer may be defined in the same manner. The plan view is a plan view in the direction perpendicular to the upper surface of the first lower electrode.

The optical adjustment layer 135 is adjusted such that the optical distance 137 from a light-emitting surface to the reflective layer is a strengthening distance. The optical distance can be measured from the light-emitting surface and may also be measured from the interface between the light-emitting layer and an adjacent layer. The term "strengthening", as used herein, means that light intensity is increased by interference between light emitted from the organic compound layer 111 and light from the reflective layer 136. To this end, the thickness of the optical adjustment layer may be adjusted such that the optical distance is $\lambda/4$, wherein $\lambda$ denotes the wavelength to be strengthen. This point is not the only strengthening distance, and ±45 nm is allowed. The wavelength $\lambda$ to be strengthen may be a wavelength observed from the light-emitting apparatus. When the wavelength to be strengthen differs between pixels, the optical distance in the first lower electrode differs from the optical distance in the second lower electrode. More specifically, the optical distance may be different between strengthening of blue and strengthening of another color, such as green or red. The optical adjustment layer may be formed of any transparent material, such as silicon oxide, silicon nitride, silicon oxynitride, ITO, or IZO.

In the present embodiment, a transparent electrode 134' with a thickness decreased by the inclined portion of the third lower electrode is coupled to the reflective layer 136 via a barrier metal 138. The barrier metal 138 can be selected so as not to increase the electrical resistance of a contact 139. Examples of the barrier metal include tungsten, titanium, and molybdenum. Furthermore, to reduce color mixture due to light recombined in the recess portion 117, the barrier metal layer can be formed of a material with a lower optical reflectance than that of the reflective electrode.

In the present embodiment, the organic compound layer 111 with a thickness decreased by the inclined portion of the third lower electrode contributes to the reduction of the leakage current as in other embodiments.

Sixth Embodiment

Figure 6A:
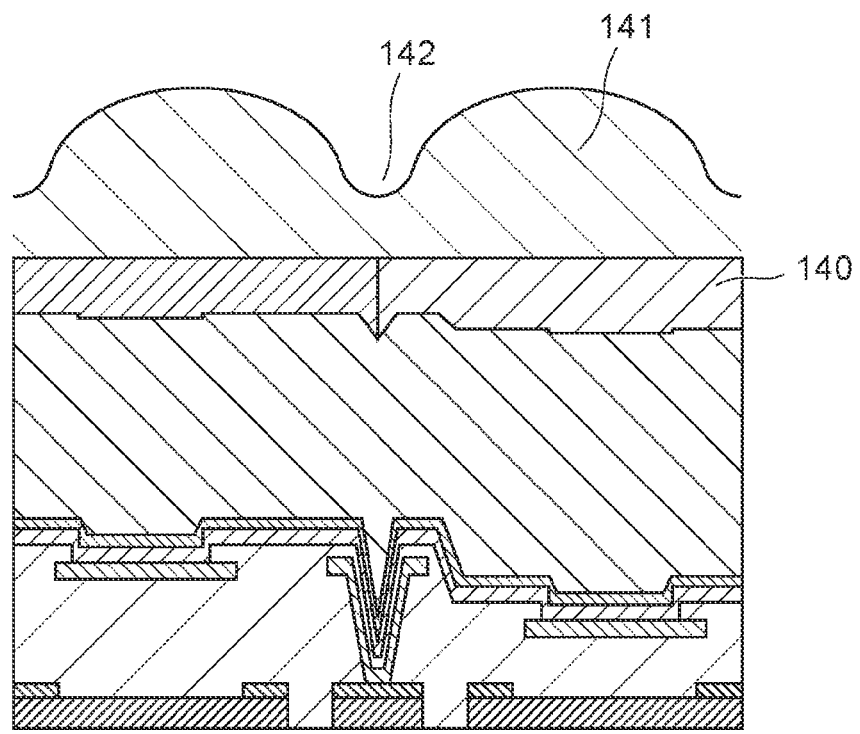
FIG. 6A is a schematic view of a modified example of a light-emitting apparatus according to an embodiment of the present disclosure with a color filter and a lens.
Figure 6B:
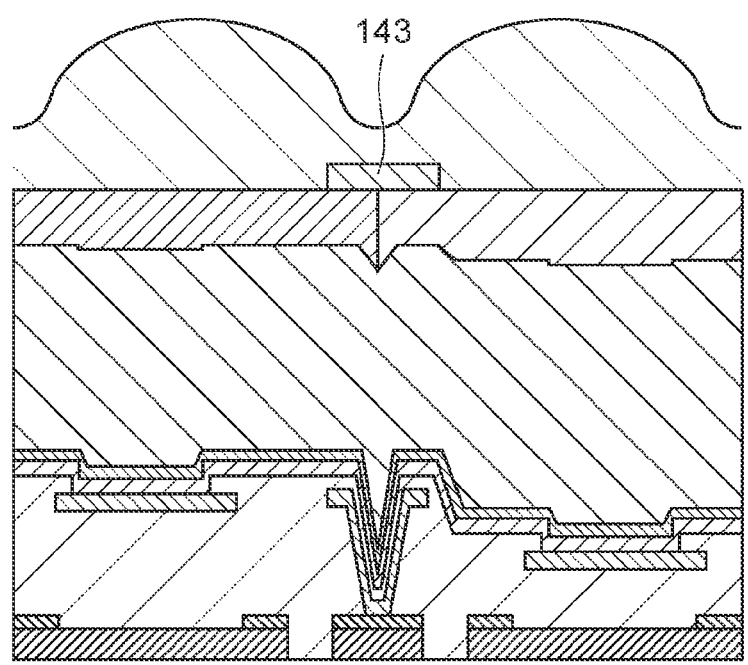
FIG. 6B is a schematic view of a light-emitting apparatus according to an embodiment of the present disclosure with a light-shielding member in addition to a color filter and a lens.

FIGS. 6A and 6B are schematic cross-sectional views of examples of a light-emitting apparatus according to an embodiment of the present disclosure. In FIG. 6A, a color filter 140 and a lens 141 are located on a protective layer. In other words, the color filter and the lens are located on an upper electrode. The color filter is composed of a first color filter overlapping a first lower electrode in a plan view and a second color filter overlapping a second lower electrode in a plan view. The first color filter and the second color filter may transmit light of the same wavelength or different wavelengths. More specifically, the first color filter may transmit blue, and the second color filter may transmit green. Furthermore, a third color filter may be provided.

The lens may be a convex lens in the first direction perpendicular to the upper surface of the first lower electrode. The first direction is upward in the figure in the present embodiment but may be downward. The lens is composed of a first convex portion overlapping the first lower electrode in a plan view and protruding in the first direction, a second convex portion overlapping the second lower electrode in a plan view and protruding in the first direction, and a third convex portion 142 located between the first convex portion and the second convex portion and protruding in a second direction opposite to the first direction.

The third convex portion overlaps a third lower electrode in a plan view. In particular, an inclined portion of the third lower electrode can overlap the third convex portion in a plan view. The inclined portion of the third lower electrode facilitates recombination between holes and electrons and may emit weak light. Even when such light emission occurs, the third convex portion of the lens overlaps a portion where recombination is likely to occur, and prevents light from being extracted. The third convex portion 142 is also referred to as a lens boundary.

In FIG. 6B, in addition to the color filter 140 and the lens 141, a light-shielding member 143 is located on the protective layer. The light-shielding member 143 further reduces light emission from the third lower electrode, in addition to the reduction of light extraction by the third convex portion.

The light-shielding member 143 may be a light-absorbing resin, such as photoresist, or may be a light absorber formed by overlap between the first color filter and the second color filter. In the case of overlap between the color filters, the overlap between the first color filter and the second color filter in a plan view is a light absorber. The first color filter and the second color filter may absorb light of different wavelengths. More specifically, the first color filter may transmit red, and the second color filter may transmit green.

The light-shielding member may be a light absorber. Although a light-reflecting member can also play a role of light shielding, it is undesirable that a reflected beam is extracted as unintended light. Thus, the light-shielding member can be a light absorber.

[Structure of Organic Light-Emitting Element]

A structure of an organic light-emitting element including an organic compound layer as a functional layer is described below. An organic light-emitting element is also referred to as an organic EL element.

An organic light-emitting element includes an insulating layer, a first electrode, an organic compound layer, and a second electrode on a substrate. A protective layer, a color filter, a microlens, or the like may be provided on the negative electrode. When a color filter is provided, a planarization layer may be provided between the color filter and a protective layer. The planarization layer may be composed of an acrylic resin or the like. The same applies to a planarization layer provided between a color filter and a microlens.

[Substrate]

The substrate may be formed of quartz, glass, silicon wafer, resin, metal, or the like. The substrate may have a switching element, such as a transistor, and a wire, on which an insulating layer may be provided. The insulating layer may be composed of any material, provided that the insulating layer can have a contact hole for wiring between the insulating layer and the first electrode and is insulated from unconnected wires. For example, the insulating layer may be formed of a resin, such as polyimide, silicon oxide, or silicon nitride.

[Electrode]

A pair of electrodes can be used as electrodes. The pair of electrodes may be a positive electrode and a negative electrode. When an electric field is applied in a direction in which the organic light-emitting element emits light, an electrode with a high electric potential is a positive electrode, and the other electrode is a negative electrode. In other words, the electrode that supplies holes to the light-emitting layer is a positive electrode, and the electrode that supplies electrons is a negative electrode.

A constituent material of the positive electrode can have as large a work function as possible. Examples of the constituent material include metal elements, such as gold, platinum, silver, copper, nickel, palladium, cobalt, selenium, vanadium, and tungsten, mixtures thereof, alloys thereof, and metal oxides, such as tin oxide, zinc oxide, indium oxide, indium tin oxide (ITO), and indium zinc oxide. Electrically conductive polymers, such as polyaniline, polypyrrole, and polythiophene, may also be used.

These electrode materials may be used alone or in combination. The positive electrode may be composed of a single layer or a plurality of layers.

When used as a reflective electrode, for example, chromium, aluminum, silver, titanium, tungsten, molybdenum, an alloy thereof, or a laminate thereof can be used. These materials can also function as a reflective film that does not have a role as an electrode. When used as a transparent electrode, an oxide transparent conductive layer, such as indium tin oxide (ITO) or indium zinc oxide, can be used. However, the present disclosure is not limited thereto. The electrodes may be formed by photolithography.

A constituent material of the negative electrode can be a material with a small work function. For example, an alkali metal, such as lithium, an alkaline-earth metal, such as calcium, a metal element, such as aluminum, titanium, manganese, silver, lead, or chromium, or a mixture thereof may be used. An alloy of these metal elements may also be used. For example, magnesium-silver, aluminum-lithium, aluminum-magnesium, silver-copper, or zinc-silver may be used. A metal oxide, such as indium tin oxide (ITO), may also be used. These electrode materials may be used alone or in combination. The negative electrode may be composed of a single layer or a plurality of layers. Among them, silver can be used, and a silver alloy can be used to reduce the aggregation of silver. As long as the aggregation of silver can be reduced, the alloy may have any ratio. For example, the ratio of silver to another metal may be 1:1, 3:1, or the like.

The negative electrode may be an oxide conductive layer, such as ITO, for a top emission device or may be a reflective electrode, such as aluminum (Al), for a bottom emission device. The negative electrode may be formed by any method. A direct-current or alternating-current sputtering method can achieve good film coverage and easily decrease resistance.

[Organic Compound Layer]

The organic compound layer may be formed of a single layer or a plurality of layers. Depending on their functions, a plurality of layers may be referred to as a hole-injection layer, a hole-transport layer, an electron-blocking layer, a light-emitting layer, a hole-blocking layer, an electron-transport layer, or an electron-injection layer. The organic compound layer is mainly composed of an organic compound and may contain an inorganic atom or an inorganic compound. For example, the compound layer may contain copper, lithium, magnesium, aluminum, iridium, platinum, molybdenum, zinc, or the like. The organic compound layer may be located between the first electrode and the second electrode and may be in contact with the first electrode and the second electrode.

[Protective Layer]

A protective layer may be provided on the negative electrode. For example, a glass sheet with a moisture absorbent may be attached to the negative electrode to decrease the amount of water or the like entering the organic compound layer and reduce the occurrence of display defects. In another embodiment, a passivation film, such as silicon nitride, may be provided on the negative electrode to decrease the amount of water or the like entering the organic compound layer. For example, after the negative electrode is formed, the negative electrode is transferred to another chamber without breaking the vacuum, and a silicon nitride film with a thickness of 2 μm may be formed as a protective layer by a CVD method. The protective layer may be formed by the CVD method followed by an atomic layer deposition (ALD) method. A film formed by the ALD method may be formed of any material such as silicon nitride, silicon oxide, or aluminum oxide. Silicon nitride may be further deposited by the CVD method on the film formed by the ALD method. The film formed by the ALD method may have a smaller thickness than the film formed by the CVD method. More specifically, the thickness of the film formed by the ALD method may be 50% or less or even 10% or less of the thickness of the film formed by the CVD method.

[Color Filter]

A color filter may be provided on the protective layer. For example, a color filter that matches the size of the organic light-emitting element may be provided on another substrate and may be bonded to the substrate on which the organic light-emitting element is provided, or a color filter may be patterned on the protective layer by photolithography. The color filter may be composed of a polymer.

[Planarization Layer]

A planarization layer may be provided between the color filter and the protective layer. The planarization layer is provided to reduce the roughness of the underlayer. The planarization layer is sometimes referred to as a material resin layer with any purpose. The planarization layer may be composed of an organic compound and can be composed of a high-molecular-weight compound, though it may be composed of a low-molecular-weight compound.

The planarization layer may be provided above and below the color filter, and the constituent materials thereof may be the same or different. Specific examples include polyvinylcarbazole resins, polycarbonate resins, polyester resins, ABS resins, acrylic resins, polyimide resins, phenolic resins, epoxy resins, silicone resins, and urea resins.

[Microlens]

The organic light-emitting element may include an optical member, such as a microlens, on the light output side. The microlens may be composed of an acrylic resin, an epoxy resin, or the like. The microlens may be used to increase the amount of light extracted from the organic light-emitting element and control the direction of the extracted light. The microlens may have a hemispherical shape. For a hemispherical microlens, the vertex of the microlens is a contact point between the hemisphere and a tangent line parallel to the insulating layer among the tangent lines in contact with the hemisphere. The vertex of the microlens in a cross-sectional view can be determined in the same manner. More specifically, the vertex of the microlens in a cross-sectional view is a contact point between the semicircle of the microlens and a tangent line parallel to the insulating layer among the tangent lines in contact with the semicircle.

The midpoint of the microlens can also be defined. In a cross section of the microlens, a midpoint of a line segment from one end point to the other end point of the arc can be referred to as a midpoint of the microlens. A cross section in which the vertex and the midpoint are determined may be perpendicular to the insulating layer.

[Opposite Substrate]

An opposite substrate may be provided on the planarization layer. The opposite substrate is so called because it faces the substrate. The opposite substrate may be composed of the same material as the substrate. When the substrate is a first substrate, the opposite substrate may be a second substrate.

[Organic Layer]

An organic compound layer (a hole-injection layer, a hole-transport layer, an electron-blocking layer, a light-emitting layer, a hole-blocking layer, an electron-transport layer, an electron-injection layer, etc.) constituting an organic light-emitting element according to an embodiment of the present disclosure is formed by the following method.

An organic compound layer constituting an organic light-emitting element according to an embodiment of the present disclosure can be formed by a dry process, such as a vacuum evaporation method, an ionized deposition method, sputtering, or plasma. Instead of the dry process, a wet process may also be employed in which a layer is formed by a known coating method (for example, spin coating, dipping, a casting method, an LB method, an ink jet method, etc.) using an appropriate solvent.

A layer formed by a vacuum evaporation method, a solution coating method, or the like undergoes little crystallization or the like and has high temporal stability. When a film is formed by a coating method, the film may also be formed in combination with an appropriate binder resin.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

These binder resins may be used alone as a homopolymer or a copolymer or may be used in combination. If necessary, an additive agent, such as a known plasticizer, oxidation inhibitor, and/or ultraviolet absorbent, may also be used.

[Pixel Circuit]

A light-emitting apparatus may include a pixel circuit coupled to the light-emitting element. The pixel circuit may be of an active matrix type, which independently controls the light emission of a first light-emitting element and a second light-emitting element. The active-matrix circuit may be of voltage programming or current programming. The drive circuit has a pixel circuit for each pixel. The pixel circuit may include a light-emitting element, a transistor for controlling the luminance of the light-emitting element, a transistor for controlling light emission timing, a capacitor for holding the gate voltage of the transistor for controlling the luminance, and a transistor for GND connection without through the light-emitting element.

A light-emitting apparatus includes a display region and a peripheral region around the display region. The display region includes the pixel circuit, and the peripheral region includes a display control circuit. The mobility of a transistor constituting the pixel circuit may be smaller than the mobility of a transistor constituting the display control circuit.

The gradient of the current-voltage characteristics of a transistor constituting the pixel circuit may be smaller than the gradient of the current-voltage characteristics of a transistor constituting the display control circuit. The gradient of the current-voltage characteristics can be determined by so-called Vg-Ig characteristics.

A transistor constituting the pixel circuit is a transistor coupled to a light-emitting element, such as a first light-emitting element.

[Pixel]

An organic light-emitting element has a plurality of pixels. Each pixel has subpixels that emit light of different colors. For example, the subpixels may have RGB emission colors.

In each pixel, a region also referred to as a pixel aperture emits light. This region is the same as the first region. The pixel aperture may be 15 µm or less or 5 µm or more. More specifically, the pixel aperture may be 11 µm, 9.5 µm, 7.4 µm, or 6.4 µm.

The distance between the subpixels may be 10 µm or less, more specifically, 8 µm, 7.4 µm, or 6.4 µm.

The pixels may be arranged in a known form in a plan view. Examples include stripe arrangement, delta arrangement, PenTile arrangement, and Bayer arrangement. Each subpixel may have any known shape in a plan view. Examples include quadrangles, such as a rectangle and a rhombus, and a hexagon. As a matter of course, a figure that is not strictly rectangular but is close to rectangular is also included in the rectangle. The shape of each subpixel and the pixel array can be used in combination.

[Applications of Organic Light-Emitting Element According to Embodiment of Present Disclosure]

An organic light-emitting element according to an embodiment of the present disclosure can be used as a constituent of a display apparatus or a lighting apparatus.

Other applications include an exposure light source of an electrophotographic image-forming apparatus, a backlight of a liquid crystal display, and a light-emitting apparatus with a color filter in a white light source.

The display apparatus may include an image input unit for inputting image information from an area CCD, a linear CCD, a memory card, or the like, may include an information processing unit for processing the input information, and may be an image-information-processing apparatus for displaying an input image on a display unit.

A display unit of an imaging apparatus or an ink jet printer may have a touch panel function. A driving system of the touch panel function may be, but is not limited to, an infrared radiation system, an electrostatic capacitance system, a resistive film system, or an electromagnetic induction system. The display apparatus may be used for a display unit of a multifunction printer.

Next, the display apparatus according to the present embodiment is described with reference to the accompanying drawings.

Figure 7A:
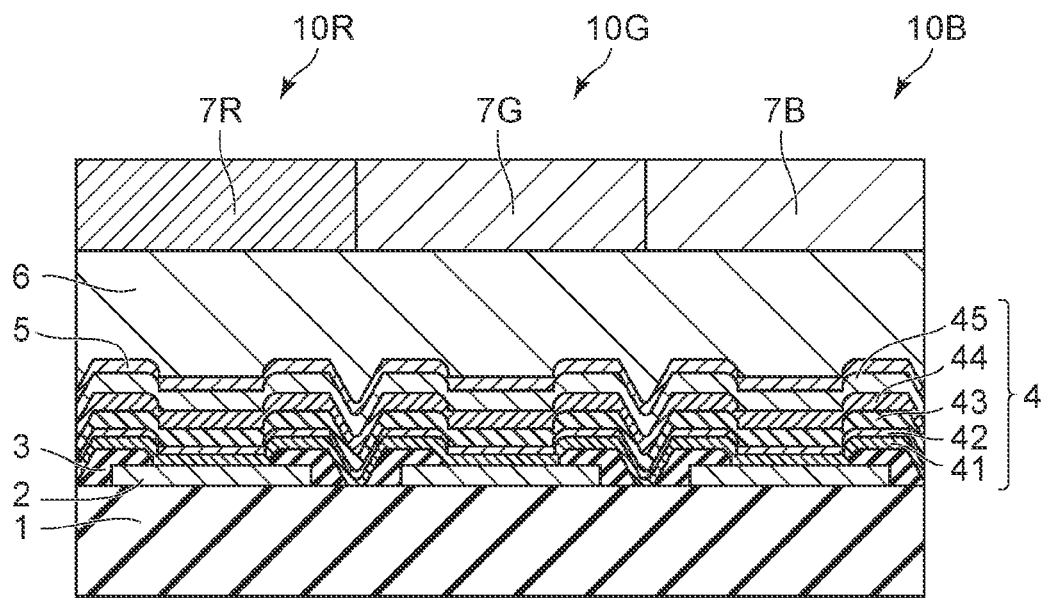
FIG. 7A is a schematic cross-sectional view of an example of a pixel of a display apparatus according to an embodiment of the present disclosure.
Figure 7B:
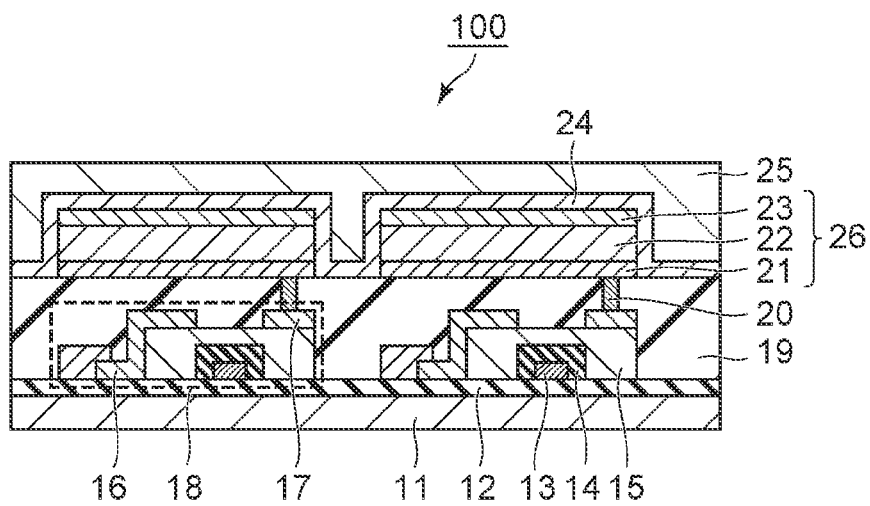
FIG. 7B is a schematic cross-sectional view of an example of a display apparatus including an organic light-emitting element according to an embodiment of the present disclosure.

FIGS. 7A and 7B are schematic cross-sectional views of a display apparatus that includes an organic light-emitting element and a transistor coupled to the organic light-emitting element. The transistor is an example of an active element. The transistor may be a thin-film transistor (TFT).

FIG. 7A illustrates a pixel serving as a constituent of the display apparatus according to the present embodiment. The pixel has subpixels 10. The subpixels are 10R, 10G, and 10B with different emission colors. The emission colors may be distinguished by the wavelength emitted from the light-emitting layer, or light emitted from each subpixel may be selectively transmitted or color-converted with a color filter or the like. Each subpixel has, on an interlayer insulating layer 1, a reflective electrode 2 as a first electrode, an insulating layer 3 covering the ends of the reflective electrode 2, organic compound layers 4 covering the first electrode and the insulating layer, a second electrode 5, a protective layer 6, and a color filter 7.

A transistor and/or a capacitor element may be provided under or inside the interlayer insulating layer 1. The transistor may be electrically connected to the first electrode via a contact hole (not shown) or the like.

The insulating layer 3 is also referred to as a bank or a pixel separation film. The insulating layer 3 covers the ends of the first electrode and surrounds the first electrode. A portion of the first electrode not covered with the insulating layer is in contact with the organic compound layers 4 and serves as a light-emitting region.

The organic compound layers 4 include a hole-injection layer 41, a hole-transport layer 42, a first light-emitting layer 43, a second light-emitting layer 44, and an electron-transport layer 45.

The second electrode 5 may be a transparent electrode, a reflective electrode, or a semitransparent electrode.

The protective layer 6 reduces the penetration of moisture into the organic compound layers. The protective layer is illustrated as a single layer but may be a plurality of layers. The protective layer may include an inorganic compound layer and an organic compound layer.

The color filter 7 is divided into 7R, 7G, and 7B according to the color. The color filter may be formed on a planarizing film (not shown). Furthermore, a resin protective layer (not shown) may be provided on the color filter. The color filter may be formed on the protective layer 6. Alternatively, the color filter may be bonded after being provided on an opposite substrate, such as a glass substrate.

A display apparatus 100 in FIG. 7B includes an organic light-emitting element 26 and a TFT 18 as an example of a transistor. The display apparatus 100 includes a substrate 11 made of glass, silicon, or the like and an insulating layer 12 on the substrate 11. The display apparatus 100 includes, on the insulating layer, an active element 18, such as a TFT, and a gate electrode 13, a gate-insulating film 14, and a semiconductor layer 15 of the active element. The TFT 18 is also composed of a drain electrode 16 and a source electrode 17. The TFT 18 is covered with an insulating film 19. A positive electrode 21 of the organic light-emitting element 26 is coupled to the source electrode 17 through a contact hole 20 formed in the insulating film.

Electrical connection between electrodes of the organic light-emitting element 26 (the positive electrode and a negative electrode) and the electrodes of the TFT (the source electrode and the drain electrode) is not limited to that illustrated in FIG. 7B. More specifically, it is only necessary to electrically connect one of the positive electrode and the negative electrode to one of the source electrode and the drain electrode of the TFT. TFT refers to a thin-film transistor.

Although an organic compound layer 22 is a single layer in the display apparatus 100 illustrated in FIG. 7B, the organic compound layer 22 may be composed of a plurality of layers. A first protective layer 24 and a second protective layer 25 for reducing degradation of the organic light-emitting element are provided on a negative electrode 23.

The transistor used as a switching element in the display apparatus 100 illustrated in FIG. 7B may be replaced with another switching element.

The transistor used in the display apparatus 100 in FIG. 7B is not limited to a transistor including a single crystal silicon wafer and may also be a thin-film transistor including an active layer on an insulating surface of a substrate. The active layer may be single-crystal silicon, non-single-crystal silicon, such as amorphous silicon or microcrystalline silicon, or a non-single-crystal oxide semiconductor, such as indium zinc oxide or indium gallium zinc oxide. The thin-film transistor is also referred to as a TFT element.

The transistor in the display apparatus 100 of FIG. 7B may be formed within a substrate, such as a Si substrate. The phrase "formed within a substrate" means that the substrate, such as a Si substrate, itself is processed to form the transistor. Thus, the transistor within the substrate can be considered that the substrate and the transistor are integrally formed.

In the organic light-emitting element according to the present embodiment, the luminance is controlled with the TFT, which is an example of a switching element. The organic light-emitting element can be provided on a plurality of planes to display an image at each luminance. The switching element according to the present embodiment is not limited to the TFT and may be a transistor formed of low-temperature polysilicon or an active-matrix driver formed on a substrate, such as a Si substrate. "On a substrate" may also be referred to as "within a substrate". Whether a transistor is provided within a substrate or a TFT is used depends on the size of a display unit. For example, for an approximately 0.5-inch display unit, an organic light-emitting element can be provided on a Si substrate.

Figure 8:
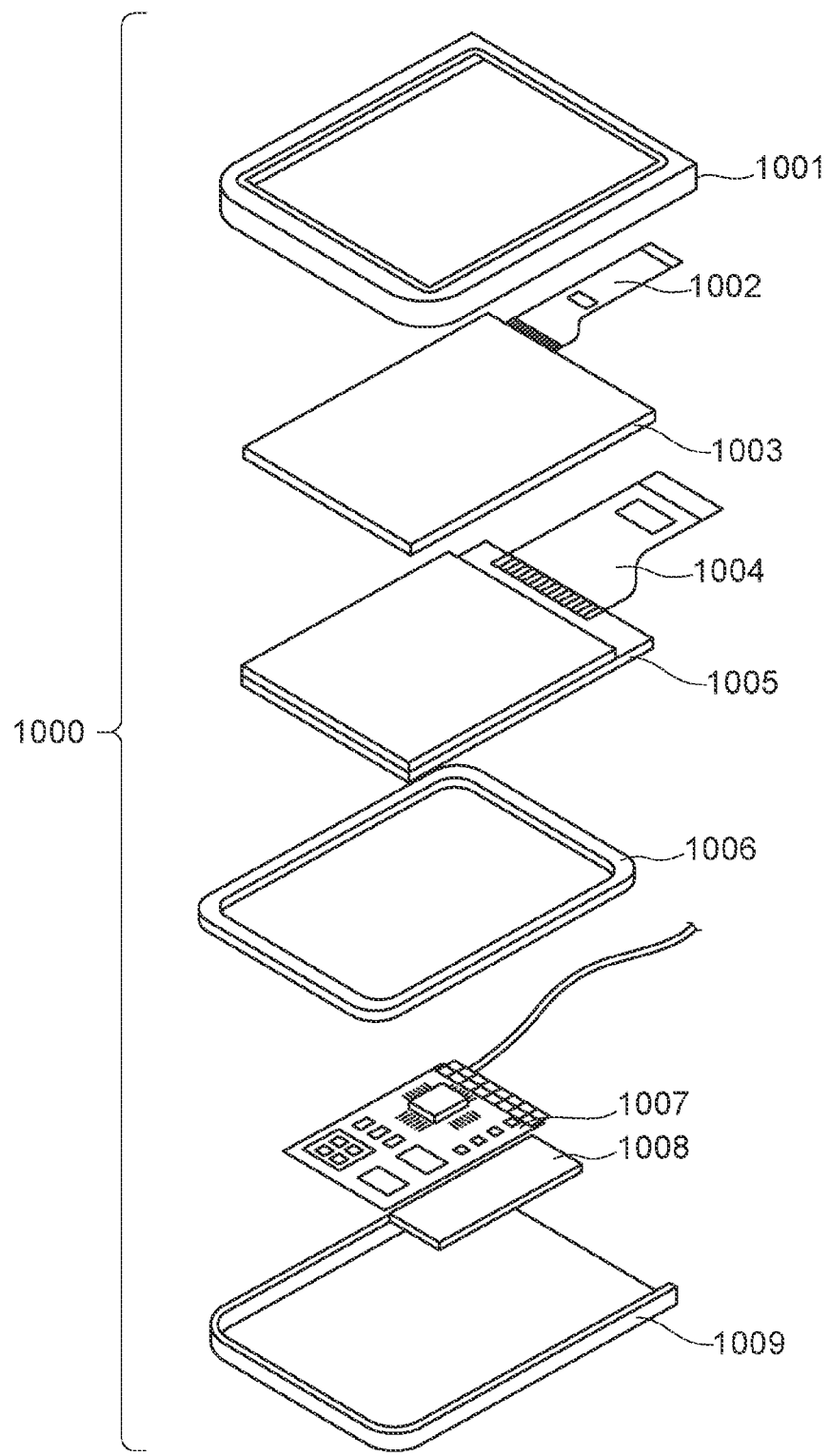
FIG. 8 is a schematic view of an example of a display apparatus according to an embodiment of the present disclosure.

FIG. 8 is a schematic view of an example of the display apparatus according to the present embodiment. A display apparatus 1000 may include a touch panel 1003, a display panel 1005, a frame 1006, a circuit substrate 1007, and a battery 1008 between an upper cover 1001 and a lower cover 1009. The touch panel 1003 and the display panel 1005 are coupled to flexible print circuits FPC 1002 and 1004, respectively. Transistors are printed on the circuit substrate 1007. The battery 1008 may not be provided when the display apparatus is not a mobile device, or may be provided at another position even when the display apparatus is a mobile device.

The display apparatus according to the present embodiment may include color filters of red, green, and blue colors. The color filters may be arranged such that the red, green, and blue colors are arranged in a delta arrangement.

The display apparatus according to the present embodiment may be used for a display unit of a mobile terminal. Such a display apparatus may have both a display function and an operation function. Examples of the mobile terminal include mobile phones, such as smartphones, tablets, and head-mounted displays.

The display apparatus according to the present embodiment may be used in a display unit of an imaging apparatus that includes an optical unit with a plurality of lenses and an imaging element for receiving light passing through the optical unit. The imaging apparatus may include a display unit for displaying information acquired by the imaging element. The display unit may be a display unit exposed outside from the imaging apparatus or a display unit located in a finder. The imaging apparatus may be a digital camera or a digital video camera.

Figure 9A:
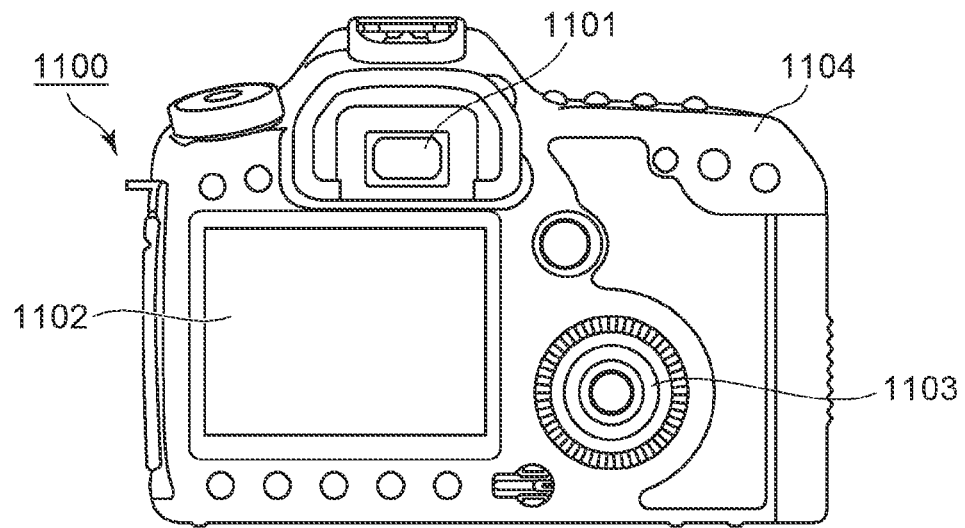
FIG. 9A is a schematic view of an example of an imaging apparatus according to an embodiment of the present disclosure.

FIG. 9A is a schematic view of an example of an imaging apparatus according to the present embodiment. An imaging apparatus 1100 may include a viewfinder 1101, a rear display 1102, an operating unit 1103, and a housing unit 1104. The viewfinder 1101 may include the display apparatus according to the present embodiment. In such a case, the display apparatus may display environmental information, imaging instructions, and the like as well as an image to be captured. The environmental information may include the intensity and direction of external light, the travel speed of the photographic subject, and the possibility that the photographic subject is shielded by a shield.

Because the appropriate timing for imaging is a short time, it is better to display information as soon as possible. Thus, a display apparatus including an organic light-emitting element according to the present disclosure can be used. This is because the organic light-emitting element has a high response speed. A display apparatus including the organic light-emitting element can be more suitably used than these apparatuses and liquid crystal displays that require a high display speed.

The imaging apparatus 1100 includes an optical unit (not shown). The optical unit has a plurality of lenses and focuses an image on an imaging element in the housing 1104. The focus of the lenses can be adjusted by adjusting their relative positions. This operation can also be automatically performed. The imaging apparatus may also be referred to as a photoelectric conversion apparatus. The photoelectric conversion apparatus can have, as an imaging method, a method of detecting a difference from a previous image or a method of cutting out a permanently recorded image, instead of taking an image one after another.

Figure 9B:
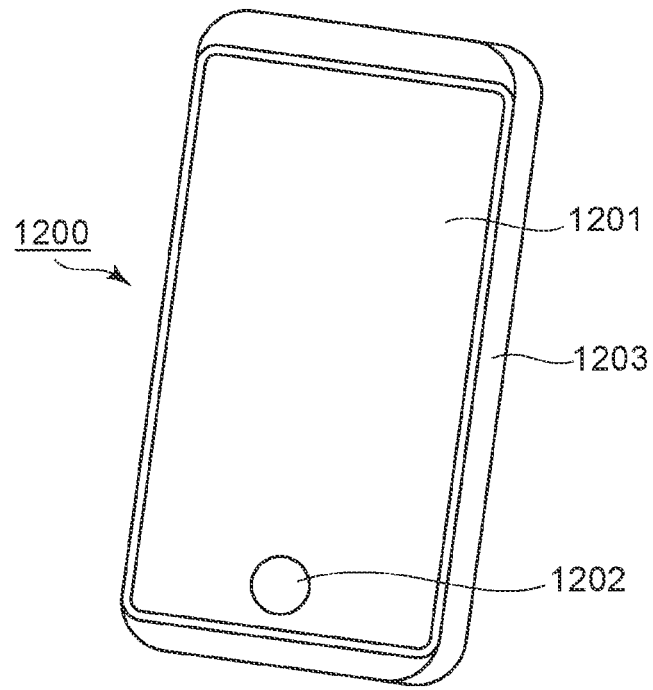
FIG. 9B is a schematic view of an example of electronic equipment according to an embodiment of the present disclosure.

FIG. 9B is a schematic view of an example of electronic equipment according to the present embodiment. Electronic equipment 1200 includes a display unit 1201, an operating unit 1202, and a housing 1203. The housing 1203 may include a circuit, a printed circuit board including the circuit, a battery, and a communication unit. The operating unit 1202 may be a button or a touch panel response unit. The operating unit may be a biometric recognition unit that recognizes a fingerprint and releases the lock. Electronic equipment with a communication unit may also be referred to as communication equipment. The electronic equipment may have a lens and an imaging element and thereby further have a camera function. An image captured by the camera function is displayed on the display unit. The electronic equipment may be a smartphone, a notebook computer, or the like.

Figure 10A:
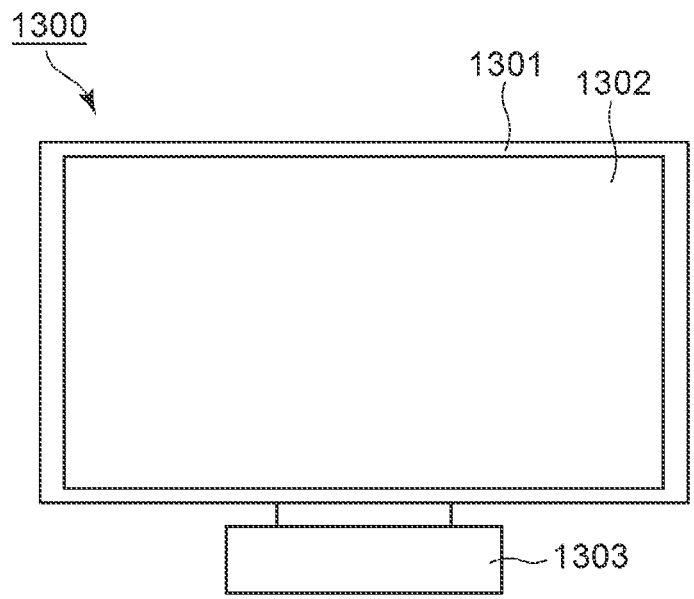
FIG. 10A is a schematic view of an example of a display apparatus according to an embodiment of the present disclosure.
Figure 10B:
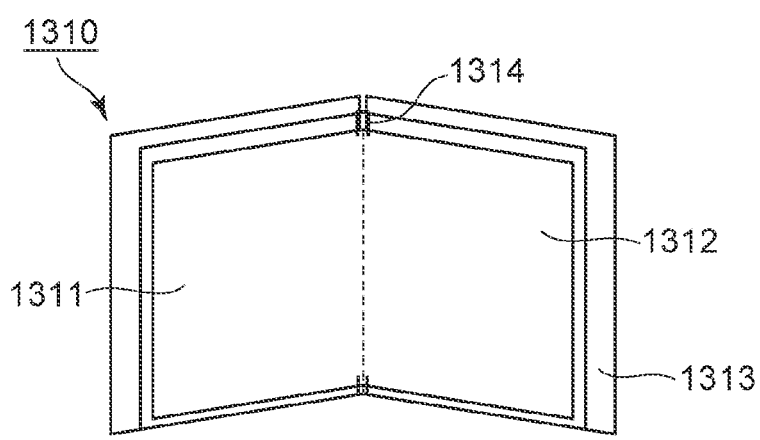
FIG. 10B is a schematic view of an example of a foldable display apparatus.

FIGS. 10A and 10B are schematic views of an example of the display apparatus according to the present embodiment. FIG. 10A illustrates a display apparatus, such as a television monitor or a PC monitor. A display apparatus 1300 includes a frame 1301 and a display unit 1302. The light-emitting apparatus according to the present embodiment may be used for the display unit 1302.

The frame 1301 and the display unit 1302 are supported by a base 1303. The base 1303 is not limited to the structure illustrated in FIG. 10A. The lower side of the frame 1301 may also serve as the base.

The frame 1301 and the display unit 1302 may be bent. The radius of curvature may range from 5000 to 6000 mm.

FIG. 10B is a schematic view of another example of the display apparatus according to the present embodiment. A display apparatus 1310 illustrated in FIG. 10B is foldable and is a so-called foldable display apparatus. The display apparatus 1310 includes a first display unit 1311, a second display unit 1312, a housing 1313, and a folding point 1314. The first display unit 1311 and the second display unit 1312 may include the light-emitting apparatus according to the present embodiment. The first display unit 1311 and the second display unit 1312 may be a single display apparatus without a joint. The first display unit 1311 and the second display unit 1312 can be divided by a folding point. The first display unit 1311 and the second display unit 1312 may display different images or one image.

A moving body according to the present embodiment may be a ship, an aircraft, a drone, or the like. The moving body may include a body and a lamp provided on the body. The lamp may emit light to indicate the position of the body. The lamp includes the organic light-emitting element according to the present embodiment.

Application examples of the display apparatus according to each of the embodiments are described below with reference to FIGS. 11A and 11B. The display apparatus can be applied to a system that can be worn as a wearable device, such as smart glasses, a head-mounted display (HMD), or smart contact lenses. An imaging and displaying apparatus used in such an application includes an imaging apparatus that can photoelectrically convert visible light and a display apparatus that can emit visible light.

Figure 11A:
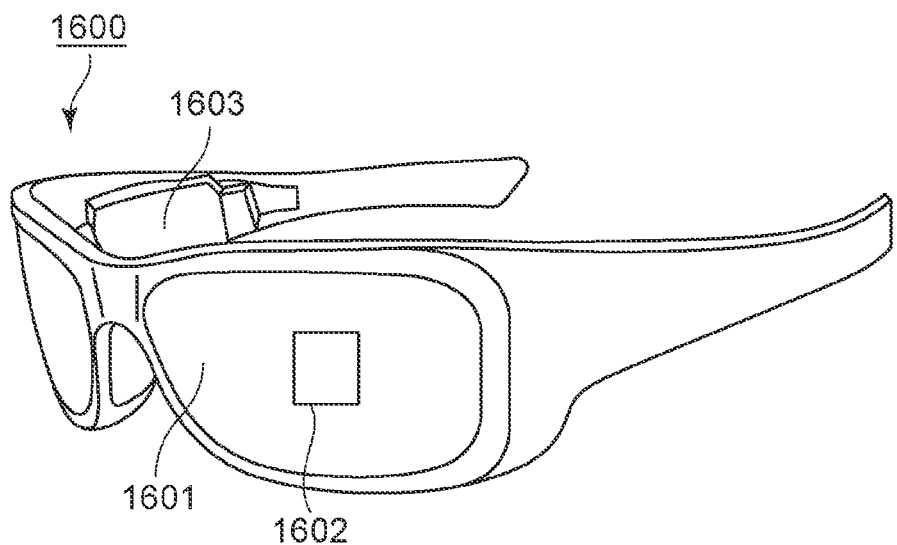
FIG. 11A is a schematic view of an example of a wearable device according to an embodiment of the present disclosure.

FIG. 11A illustrates glasses 1600 (smart glasses) according to one application example. An imaging apparatus 1602, such as a complementary metal-oxide semiconductor (CMOS) sensor or a single-photon avalanche photodiode (SPAD), is provided on the front side of a lens 1601 of the glasses 1600. The display apparatus according to one of the embodiments is provided on the back side of the lens 1601.

The glasses 1600 further include a controller 1603. The controller 1603 functions as a power supply for supplying power to the imaging apparatus 1602 and the display apparatus according to one of the embodiments. The controller 1603 controls the operation of the imaging apparatus 1602 and the display apparatus. The lens 1601 has an optical system for focusing light on the imaging apparatus 1602.

Figure 11B:
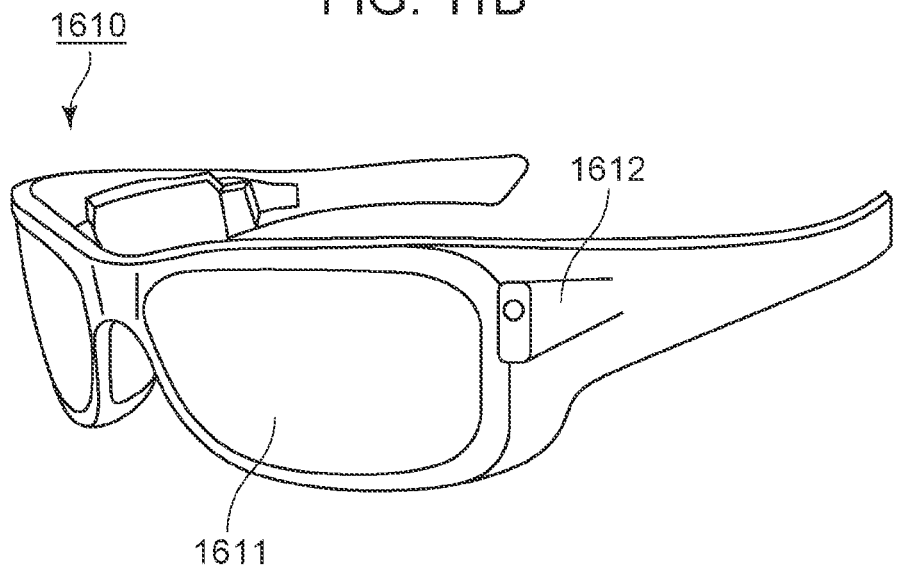
FIG. 11B is a schematic view of an example of a wearable device according to an embodiment of the present disclosure with an imaging apparatus.

FIG. 11B illustrates glasses 1610 (smart glasses) according to one application example. The glasses 1610 have a controller 1612, which includes an imaging apparatus corresponding to the imaging apparatus 1602 and a display apparatus. A lens 1611 includes an optical system for projecting light from the imaging apparatus and the display apparatus of the controller 1612, and an image is projected on the lens 1611. The controller 1612 functions as a power supply for supplying power to the imaging apparatus and the display apparatus and controls the operation of the imaging apparatus and the display apparatus. The controller may include a line-of-sight detection unit for detecting the line of sight of the wearer. Infrared radiation may be used to detect the line of sight. An infrared radiation unit emits infrared light to an eyeball of a user who is gazing at a display image. Reflected infrared light from the eyeball is detected by an imaging unit including a light-receiving element to capture an image of the eyeball. A reduction unit for reducing light from the infrared radiation unit to a display unit in a plan view is provided to reduce degradation in image quality.

The line of sight of the user for the display image is detected from the image of the eyeball obtained by capturing the infrared light. Any known technique can be applied to line-of-sight detection using the image of the eyeball. For example, it is possible to use a line-of-sight detection method based on a Purkinje image obtained by reflection of irradiation light by the cornea.

More specifically, a line-of-sight detection process based on a pupil-corneal reflection method is performed. The line of sight of the user is detected by calculating a line-of-sight vector representing the direction (rotation angle) of an eyeball on the basis of an image of a pupil and a Purkinje image included in a captured image of the eyeball using the pupil-corneal reflection method.

A display apparatus according to an embodiment of the present disclosure may include an imaging apparatus including a light-receiving element and may control a display image on the basis of line-of-sight information of a user from the imaging apparatus.

More specifically, on the basis of the line-of-sight information, the display apparatus determines a first visibility region at which the user gazes and a second visibility region other than the first visibility region. The first visibility region and the second visibility region may be determined by the controller of the display apparatus or may be received from an external controller. In the display region of the display apparatus, the first visibility region may be controlled to have higher display resolution than the second visibility region. In other words, the second visibility region may have lower resolution than the first visibility region.

The display region has a first display region and a second display region different from the first display region, and the priority of the first display region and the second display region depends on the line-of-sight information. The first visibility region and the second visibility region may be determined by the controller of the display apparatus or may be received from an external controller. A region with a higher priority may be controlled to have higher resolution than another region. In other words, a region with a lower priority may have lower resolution.

The first visibility region or a region with a higher priority may be determined by artificial intelligence (AI). The AI may be a model configured to estimate the angle of the line of sight and the distance to a target ahead of the line of sight from an image of an eyeball using the image of the eyeball and the direction in which the eyeball actually viewed in the image as teaching data. The AI program may be stored in the display apparatus, the imaging apparatus, or an external device. The AI program stored in an external device is transmitted to the display apparatus via communication.

For display control based on visual recognition detection, the present disclosure can be applied to smart glasses further having an imaging apparatus for imaging the outside. Smart glasses can display captured external information in real time.

As described above, the apparatus including the organic light-emitting element according to the present embodiment can be used to stably display a high-quality image for extended periods.

The present disclosure can provide a light-emitting apparatus with reduced leakage current between organic EL elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-059049 filed Mar. 31, 2021, which is hereby incorporated by reference herein in its entirety.

What is claimed is:

1. A light-emitting apparatus comprising:
   a first lower electrode;
   a second lower electrode;
   a functional layer covering the first lower electrode and the second lower electrode;
   an upper electrode on the functional layer; and
   a third lower electrode between the first lower electrode and the second lower electrode,
   wherein the third lower electrode has an inclined portion inclined with respect to an upper surface of the first lower electrode,
   wherein the third lower electrode, an insulating layer, the functional layer, and the upper electrode are arranged in this order in a direction perpendicular to the inclined portion,
   wherein the first lower electrode, the second lower electrode, and the third lower electrode are electrically independent of each other, and
   wherein a thickness of the functional layer at the inclined portion is less than a thickness of the functional layer at a point that the first lower electrode contacts the functional layer.

2. The light-emitting apparatus according to claim 1, wherein the insulating layer covers an end portion of the first lower electrode and extends to the second lower electrode.

3. The light-emitting apparatus according to claim 1, wherein the inclined portion forms a protrusion in a direction from the upper electrode to the first lower electrode.

4. The light-emitting apparatus according to claim 3, wherein the protrusion has a greater length than the functional layer in a direction perpendicular to the upper surface of the first lower electrode.

5. The light-emitting apparatus according to claim 3, wherein
   the functional layer includes a charge generation layer, and
   the protrusion has a length greater than a length from the upper surface of the first lower electrode to a lower surface of the charge generation layer in a direction perpendicular to the upper surface of the first lower electrode.

6. The light-emitting apparatus according to claim 5, wherein the length of the protrusion in a direction parallel to the upper surface of the first lower electrode is at least twice the length from the upper surface of the first lower electrode to the lower surface of the charge generation layer in the direction perpendicular to the upper surface of the first lower electrode.

7. The light-emitting apparatus according to claim 1, wherein the inclined portion forms a protrusion in a direction from the first lower electrode to the upper electrode.

8. The light-emitting apparatus according to claim 1, comprising:
   a first reflective layer configured to reflect light;
   a first optical adjustment layer between the first reflective layer and the first lower electrode;
   a second reflective layer configured to reflect light; and
   a second optical adjustment layer between the second reflective layer and the second lower electrode,
   wherein the first optical adjustment layer and the second optical adjustment layer have different thicknesses.

9. The light-emitting apparatus according to claim 8, wherein
   an optical distance between the first reflective layer and a portion of the functional layer overlapping the first lower electrode in a plan view is a strengthening distance, and
   an optical distance between the second reflective layer and a portion of the functional layer overlapping the second lower electrode in a plan view is a strengthening distance.

10. The light-emitting apparatus according to claim 1, comprising:
    a lens on the upper electrode,
    wherein the lens has a first convex portion overlapping the first lower electrode in a plan view and protruding in a first direction perpendicular to the upper surface of the first lower electrode, a second convex portion overlapping the second lower electrode in a plan view and protruding in the first direction, and a third convex portion protruding in a second direction opposite to the first direction between the first convex portion and the second convex portion, and
    the third convex portion overlaps the inclined portion of the third lower electrode in a plan view.

11. The light-emitting apparatus according to claim 1, comprising:
    a light-shielding member on the upper electrode,
    wherein the light-shielding member overlaps the inclined portion of the third lower electrode in a plan view.

12. The light-emitting apparatus according to claim 1, comprising:
    a first color filter overlapping the first lower electrode and a second color filter overlapping the second lower electrode in a plan view,
    wherein a point of contact between the first color filter and the second color filter overlaps the inclined portion of the third lower electrode in a plan view.

13. The light-emitting apparatus according to claim 12, comprising:
    an overlap region between the first color filter and the second color filter in a direction from the first lower electrode to the upper electrode,
    wherein the overlap region overlaps the inclined portion of the third lower electrode in a plan view.

14. The light-emitting apparatus according to claim 1, wherein the functional layer is an organic compound layer composed of an organic compound.

15. A display apparatus comprising:
    the light-emitting apparatus according to claim 1; and
    a transistor coupled to the light-emitting apparatus.

16. An imaging apparatus comprising:
    an optical unit with a plurality of lenses;
    an imaging element configured to receive light passing through the optical unit; and
    a display unit configured to display an image taken by the imaging element,
    wherein the display unit includes the light-emitting apparatus according to claim 1.

17. Electronic equipment comprising:
    a display unit including the light-emitting apparatus according to claim 1;
    a housing in which the display unit is provided; and
    a communication unit configured to communicate with an outside provided in the housing.

* * * * *